(12) United States Patent
Dittmer et al.

(10) Patent No.: US 12,719,424 B1
(45) Date of Patent: Aug. 25, 2026

(54) SCALABLE SYSTEM FOR TRACKING AND EXCITING THE RESONANT FREQUENCY OF RESONANT ACOUSTIC MEMS ACTUATORS

(71) Applicant: Trudell Medical International Inc., London (CA)

(72) Inventors: Andrew Dittmer, Woodstock (CA); Michal Fulmyk, Toronto (CA); Benjamin Russell, Oakville (CA); Bharanidharan Thamizhchelvan, London (CA)

(73) Assignee: Trudell Medical International Inc., London (CA)

( * ) Notice: Subject to any disclaimer, the term of this patent is extended or adjusted under 35 U.S.C. 154(b) by 289 days.

(21) Appl. No.: 18/665,177

(22) Filed: May 15, 2024

Related U.S. Application Data

(60) Provisional application No. 63/466,474, filed on May 15, 2023.

(51) Int. Cl.
*H03F 3/24* (2006.01)
*B05B 17/06* (2006.01)
*H03H 9/125* (2006.01)

(52) U.S. Cl.
CPC ......... *H03F 3/245* (2013.01); *B05B 17/0653* (2013.01); *H03H 9/125* (2013.01); *H03F 2200/451* (2013.01)

(58) Field of Classification Search
CPC ... H03F 3/245; H03F 2200/451; H03H 9/125; B05B 17/0653
See application file for complete search history.

(56) References Cited

U.S. PATENT DOCUMENTS

| | | | |
|---|---|---|---|
| 9,007,785 B2 | 4/2015 | Kosaka | |
| 12,063,022 B1 | 8/2024 | Dittmer et al. | |
| 2021/0321205 A1 | 10/2021 | Akers | |
| 2022/0385167 A1* | 12/2022 | Lee | H02M 1/083 |

FOREIGN PATENT DOCUMENTS

CN 1829041 A * 9/2006

OTHER PUBLICATIONS

Unexamined U.S. Appl. No. 18/772,853, filed Jul. 15, 2024, 26 pgs.

* cited by examiner

*Primary Examiner* — Stephanie E Bloss
*Assistant Examiner* — Michael A Harrison
(74) *Attorney, Agent, or Firm* — Crowell & Moring LLP

(57) ABSTRACT

A system and method for use in matching a source to a dynamic impedance electrical load is described. The system may include a zero voltage switching amplifier and a variable signal generator, where the zero voltage switching amplifier is in communication with a resonant load. The system also includes a microcontroller for executing an algorithm that causes the microcontroller to locate a resonant frequency of the resonant load by sampling frequencies by changing a frequency of the variable signal generator and recording sensor data, and then correlating the collected sensor data (minima) to the resonance.

14 Claims, 13 Drawing Sheets

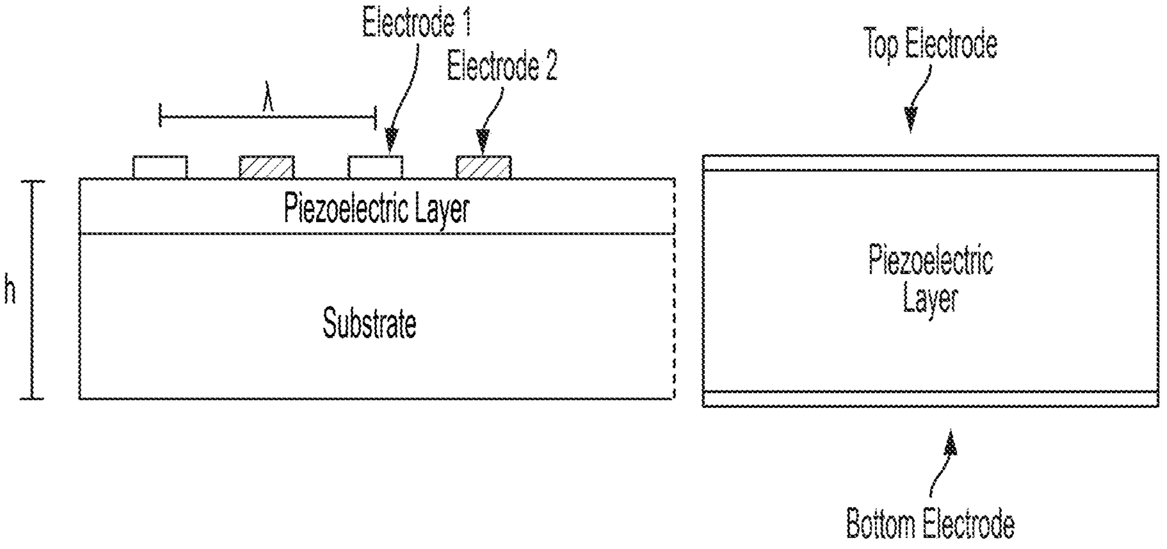
FIG. 1A
FIG. 1B
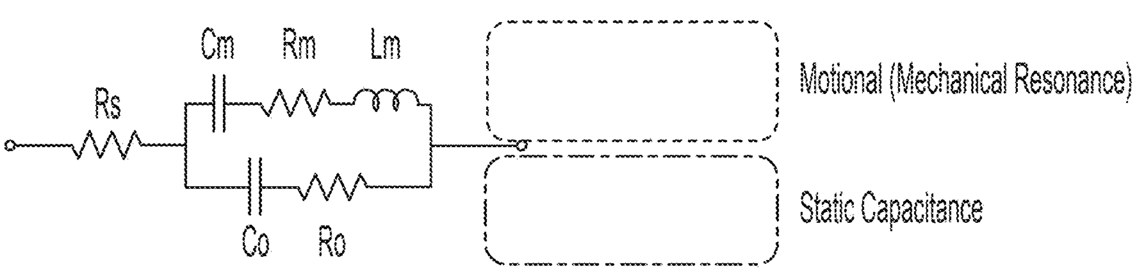
FIG. 2

SCALABLE SYSTEM FOR TRACKING AND EXCITING THE RESONANT FREQUENCY OF RESONANT ACOUSTIC MEMS ACTUATORS

CROSS-REFERENCE TO RELATED APPLICATIONS

This application claims the benefit of U.S. Provisional Patent Application No. 63/466,474, entitled "SCALABLE SYSTEM FOR TRACKING AND EXCITING THE RESONANT FREQUENCY OF RESONANT ACOUSTIC MEMS ACTUATORS", filed May 15, 2023, the entirety of which is hereby incorporated herein by reference.

FIELD OF THE INVENTION

The present disclosure relates to a system for matching signal frequency to load resonant frequency using system power, and more particularly to a system for adapting to a dynamic load, such as in a surface acoustic wave (SAW) atomizer circuit.

BRIEF DESCRIPTION OF THE DRAWINGS

FIG. 1A is an example of a SAW device.

FIG. 1B is an example of a bulk acoustic wave-film bulk acoustic resonator (BAW-FBAR) device.

FIG. 2 illustrates an electrical equivalent circuit of a dynamic resonant load device.

DETAILED DESCRIPTION

Figure 3:
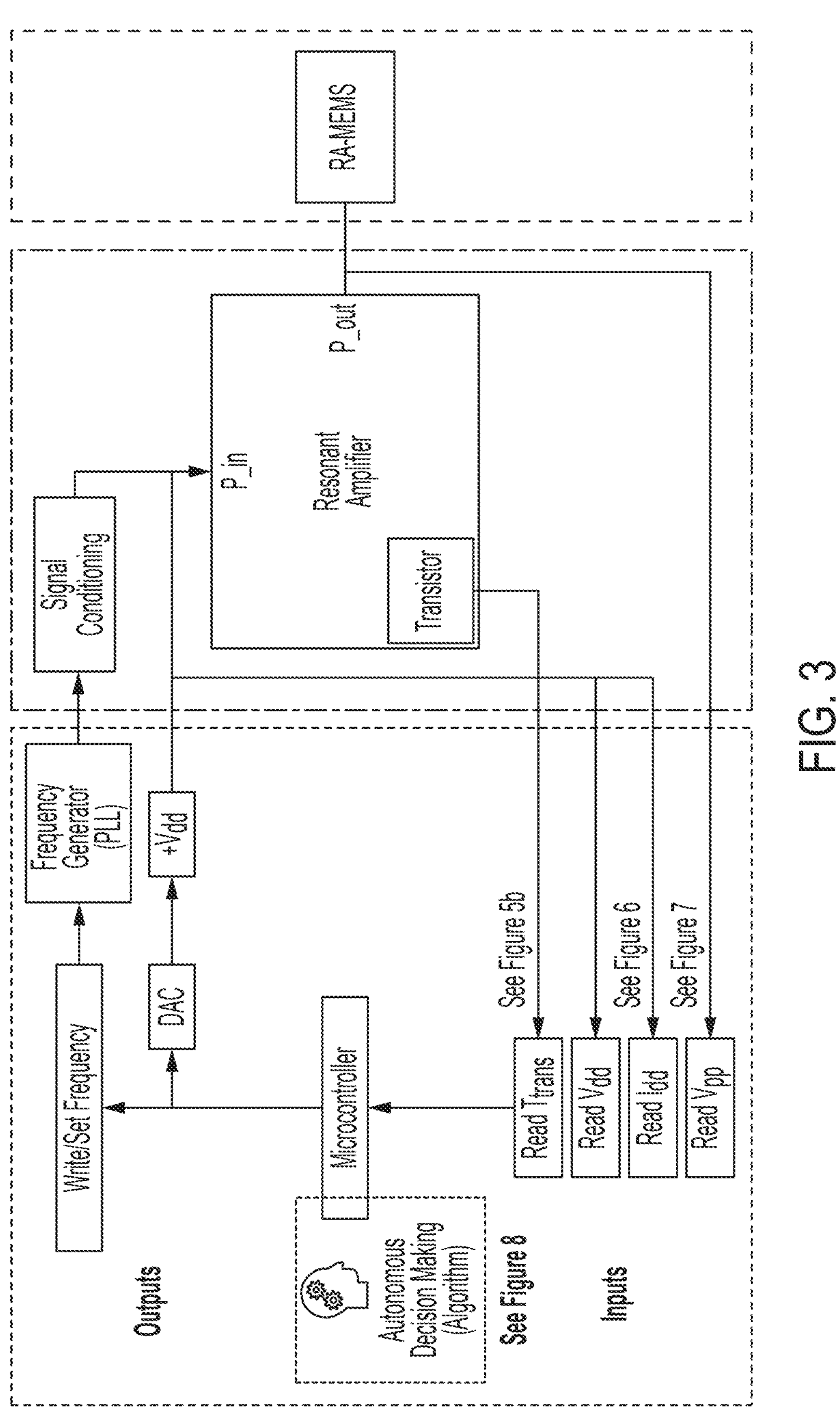
FIG. 3 is a block diagram of a system for matching a source to a dynamic load such as a RA-MEMS atomizer according to one embodiment.

There are several markets that will benefit from the excitation of a Dynamic Resonant Load, such as, for example: RA-MEMS actuators. These markets include healthcare and agriculture, specific applications include acoustofluidics and miniature heaters. RA-MEMS (resonant acoustic micro-electromechanical systems) devices use piezoelectric crystals with modern integrated circuit (IC) thin film technology to create affordable small ultrasonic devices, but the electronic equipment typically required to drive these devices is inefficient and costly. This invention addresses the efficiency and cost of the electronic driving equipment, so these devices may be brought to market. An example of one suitable RA-MEMS device is illustrated in pending U.S. application Ser. No. 17/722,785, entitled AUTONOMOUSLY MATCHING SIGNAL FREQUENCY TO LOAD RESONANT FREQUENCY USING SYSTEM POWER, filed Apr. 18, 2022, the entirety of which is hereby incorporated herein by reference.

A feature characteristic of RA-MEMS devices is their potential to be highly resonant. Different types and magnitudes of ultrasonic waves are produced in these devices for different applications, but regardless of type or application these devices all operate on the principle of resonance. How well they function will depend largely on their resonant characteristics, such as their quality factor. Quality factor may is a dimensionless parameter that describes how underdamped an oscillator or resonator is. It is defined as the ratio of the initial energy stored in the resonator to the energy lost in one radian of the cycle of oscillation. Q factor is alternatively defined as the ratio of a resonator's center frequency to its bandwidth when subject to an oscillating driving force. These two definitions give numerically similar, but not identical, results. Higher Q indicates a lower rate of energy loss and the oscillations die out more slowly. Resonators with high quality factors have low damping, so that they ring or vibrate longer.

Design considerations such as the piezoelectric material chosen, its lattice orientation and how the electric field is presented will affect the type and magnitude of the ultrasonic waves produced. Two basic structures for RA-MEMS construction are shown in FIGS. 1A and 1B.

For SAW devices the electrode spacing, and the substrate material dictate the acoustic wavelength (λ) and intrinsic wave velocity (u) respectively and together predict the resonant frequency ($f_{res}$) shown by Eq.1. For BAW devices the resonant frequency will largely depend on thickness of the piezo layer and acoustic wave velocity as seen in Eq. 2.

$$f_{res} = \frac{u}{\lambda}(SAW) \quad \text{Eq. 1}$$

$$f_{res} = \frac{u}{2h}(BAW) \quad \text{Eq. 2}$$

Other parameters will affect the devices' resonant frequency (specific electrode and edge geometry, surface textures, material stacks) but equations 1 and 2 are fundamental. The device design should consider operating conditions; in fluidic applications for example, the impedance change caused by fluid loading should be accommodated. In the case of the SAW structure the thickness to wavelength ratio (h/A), will determine if the wave will be a SAW (>1), lamb (<1), or hybrid (~1) type. For RA-MEMS devices the mechanical resonance can be found electronically due to piezoelectric effect coupling the two domains. In the electrical domain resonant frequencies are defined as the frequency where reactance is zero. There are two conditions where this occurs the series resonance and the parallel resonance or anti-resonance (see Table 1).

TABLE 1

| Defined Frequencies | |
|---|---|
| Series Resonance ($f_s$): | Where phase is zero and transitioning from capacitive to inductive. This is the resonance frequency of the motional branch. This frequency is approximately equal to: |

TABLE 1-continued

| Defined Frequencies | |
|---|---|
| | $f_s = \frac{1}{2\pi\sqrt{c_m L_m}}$ |
| Parallel Resonance ($f_p$): | Where phase is zero and transitioning from inductive to capacitive, also sometimes called anti-resonance. This frequency is approximately equal to: $f_p = f_s\sqrt{\frac{C_m + C_0}{C_0}}$ |

The series resonance of an RA-MEMS device is also the mechanical resonance. In a circuit equivalent model of a Dynamic Resonant Load device shown in FIG. 2, the series branch is often referred to as the "motional branch".

In this model of a Dynamic Resonant Load, for an RA-MEMS load, the motional branch represents the acoustic behavior, and the static capacitance branch represents the electrostatic behavior. The "Rs" represents losses in the electrodes. The series (or motional) branch resonance should be close to $f_{res}$ from Eq. 1 and 2.

$$f_{res} \approx f_s \quad \text{Eq. 3}$$

A system that is able to detect the series resonance and adjust the operating frequency of the amplifier to be within the range of the of the series resonance will achieve peak system efficiency and mechanical wave amplitude in an RA-MEMS device.

Resonant Load actuators require their stimulus signal to be within a relatively narrow band of frequencies otherwise the mechanical performance will be poor or the system may fail to function and perhaps damage the components comprising the system. This narrow frequency band, near resonance, however, will vary with manufacturing (crystal properties, photolithography tolerances, assembly residual stresses), changing environments, and operating conditions (Temperature, mass loading, wear, and other stressors) which inevitably leads to misalignments of stimulus with respect to the band without intervention. As such, the Resonant Load will be referred to as a Dynamic Resonant Load as there are dynamic factors which depend on the manufacturing, environment and operating conditions.

The risk for misalignment increases for higher powered applications, such as, for example, acoustofluidics (vibration/mixing, translation, jetting and atomization) or heating. The higher powers required at resonance lead to larger temperature swings, which cause the resonant frequencies and the passband to change. This sensitivity to temperature is characterized by the crystal's temperature coefficient of frequency or delay (TCF or TCD). TCF is a device characteristic that indicates thermal frequency stability. Defined as relative change in resonant frequency with temperature, and usually expressed in ppm/K:

$$TCF = \frac{1}{f}\frac{df}{dT}.$$

There are techniques that can help to mitigate the risk of a misaligned signal. Techniques such as: Environmental control, passivation layers (SiO2), alternate piezoelectric materials, and IDT chirping but these always seem to lead to higher cost, complexity, and system efficiency losses.

There are also existing electronic tools that can detect the Resonant Load resonance frequency ($f_s$), such as Vector Network Analyzers (VNAs), but this equipment is sensitive and easily damaged. One group has built a VNA into their controller to periodically sweep and detect the device resonance allowing it to track resonance. Another group uses an AB power amplifier and seeks maximum current/power to track resonance. Both implementations may serve a wide range of frequencies but are limited in output power ≤2 W with costly signal conditioning and output stages in the published designs.

One embodiment of the system presented herein consists of a microcontroller, a variable signal generator, common sensors (current, voltage, temperature), a resonant switching amplifier and a Dynamic Resonant Load device. (See FIG. 3).

The microcontroller of this system is programmed (see flowcharts below) to read sensor data (FIGS. 5-7) and locate the resonant frequency of the Dynamic Resonant Load, it also controls the signal generator to excite the resonance.

The following section will define a set of items comprising a set of parameters to operate the system in an optimal setting. There are four items to consider in order to achieve optimal system operation: Amplifier Efficiency, Mechanical Performance of a Resonant Load, System Efficiency, and Frequency of Operation.

1) Amplifier Efficiency:

$$\text{Amplifier Efficiency} = \frac{P_{out}}{P_{in}} \quad \text{Eq. 4}$$

Amplifier Efficiency is defined as the power output from the amplifier (Pout) to the Resonant Load as a numerator to the input power into the amplifier (Pin).

2) Mechanical Load Performance:

The Mechanical Performance of a Resonant Load occurs when the load is excited at or near the resonance frequency of the Resonant Load. We shall call the Mechanical Performance of the load as P Mechanical (Power Mechanical).

3) System Efficiency:

$$\text{System Efficiency} = \frac{P_{Mechanical}}{P_{in}} \quad \text{Eq. 5}$$

System Efficiency is defined as the mechanical power output of the Resonant Load as a numerator of the input power to the entire power amplifier exciting the load.

4) Peak System Performance:

The Peak System Performance is achieved when the System Efficiency is maximized. Ideally this may occur when P Mechanical is maximized, and Pin is minimized. For a System comprising a Resonant Power Amplifier and Resonant Load, this exact scenario occurs when the frequency of operation is selected to equal the resonant frequency of the load.

The Resonant Switching Amplifier: Class E

Figure 4:
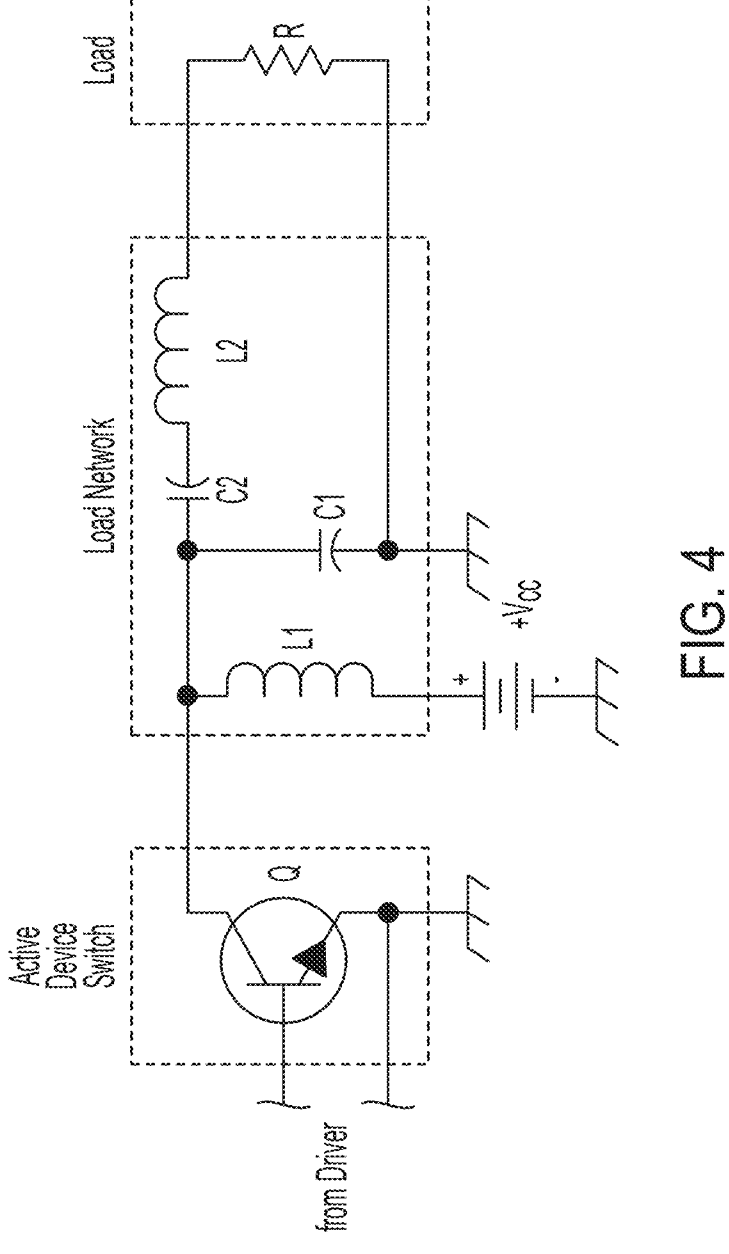
FIG. 4 is an example of a class E amplifier for use in the system of FIG. 3.

Resonant switching amplifiers, in our implementation we used a Class E power amplifier, are known for being efficient within a frequency band defined by the choice of transistor, reactive components, and expected load impedance range. The design of the amplifier depends on knowing the region of frequency operation of the load a priori, as such the selection of component may match the expected frequency of operation. The Resonant Amplifier will be designed to be efficient at a purely resistive load within the expected range of values for the Resonant Load at the resonance frequency. The basic layout of a class E amplifier is depicted in FIG. 4.

When class E amplifiers are designed, the frequency of operation and component selection maintain Zero Voltage Switching (ZVS): the current and voltage waveforms through the transistor are out of phase. During the "on" state of a ZVS device the voltage is nearly zero when high current is flowing, that is, the transistor acts as a low resistance closed switch during the "on" part of the RF period. In the "off" state of a ZVS device, the current is zero when there is high voltage, that is, the transistor acts as an open switch during the "off" part of the RF period.

This minimizes power losses and provides the high efficiency of Class E Amplifiers. The ZVS operation may, however, be disrupted if the load impedance is outside of the expected range of values. If a load impedance outside of the designed-for-impedance-range is presented, the Class E amplifier will experience non-ZVS and exhibit, as compared to a purely resistive load, a higher input current, larger amplitudes on the output voltage, larger power losses and corresponding temperature increases of components due to the increased power losses.

The theoretical efficiency of a Class E power amplifier is 100%, however, practical implementations may achieve performance of >80-90% to a well-defined static load. A Dynamic Resonant Load, however, may severely impact the performance of a Class E amplifier. For resonant loads the ZVS condition, and amplifier efficiency, is best satisfied when driver signal is set to near the series resonant frequency of the load (FIG. 5). This would introduce a purely resistive load, in line with the type of load the amplifier was design for. As the signal frequency deviates from the load's resonant frequency, the ZVS condition and amplifier efficiencies will quickly deteriorate. As the amplifier efficiency deteriorates, so does the system efficiency, as the input power Pin, would sharply rise if the system operates at a non-resonance frequency for the RA-MEMS. The systems sensitivity to frequency will depend on how quickly the load's impedance varies with frequency (or Q factor).

Figure 5A:
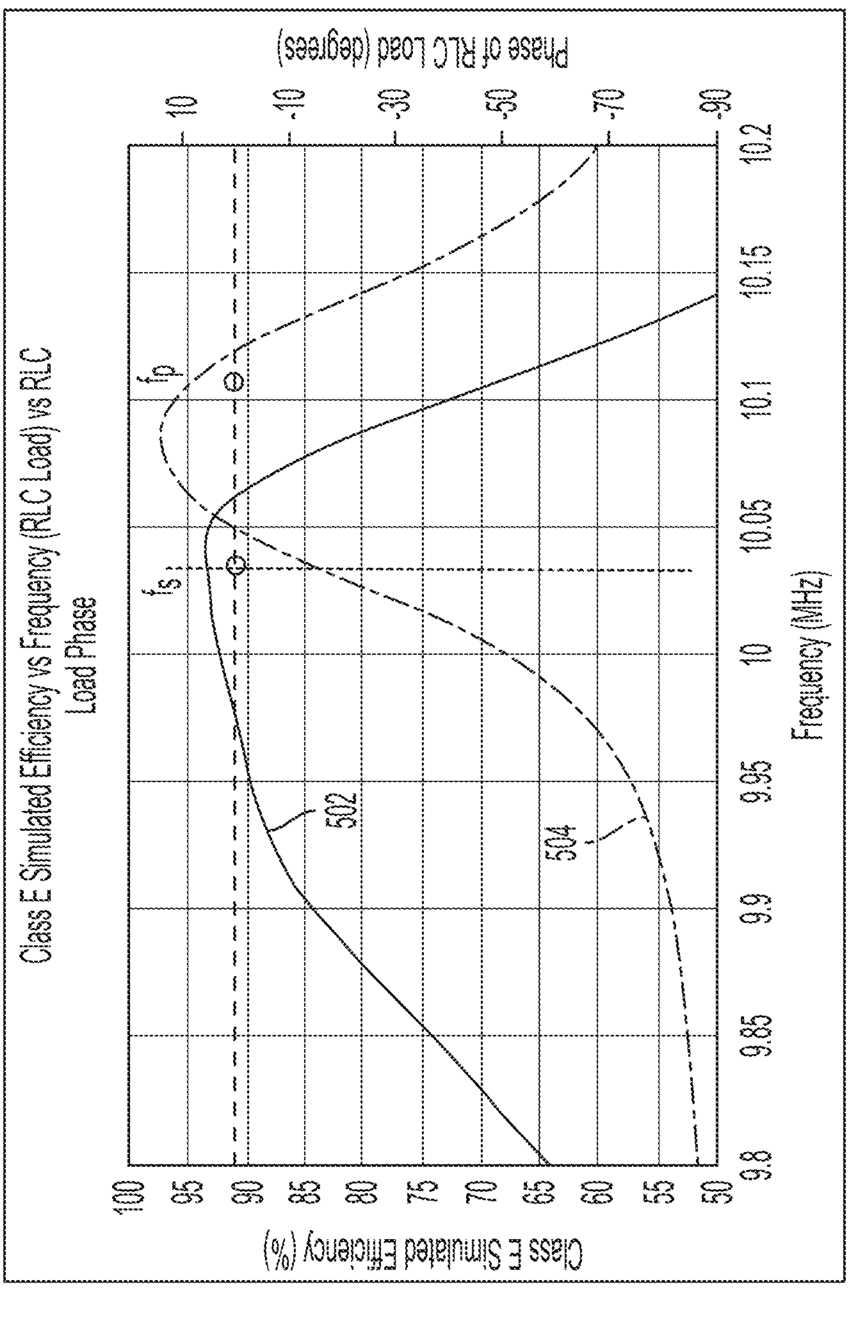
FIG. 5A is a comparison chart of simulated system efficiency versus frequency of a modelled RA-MEMS SAW device.
Figure 5B:
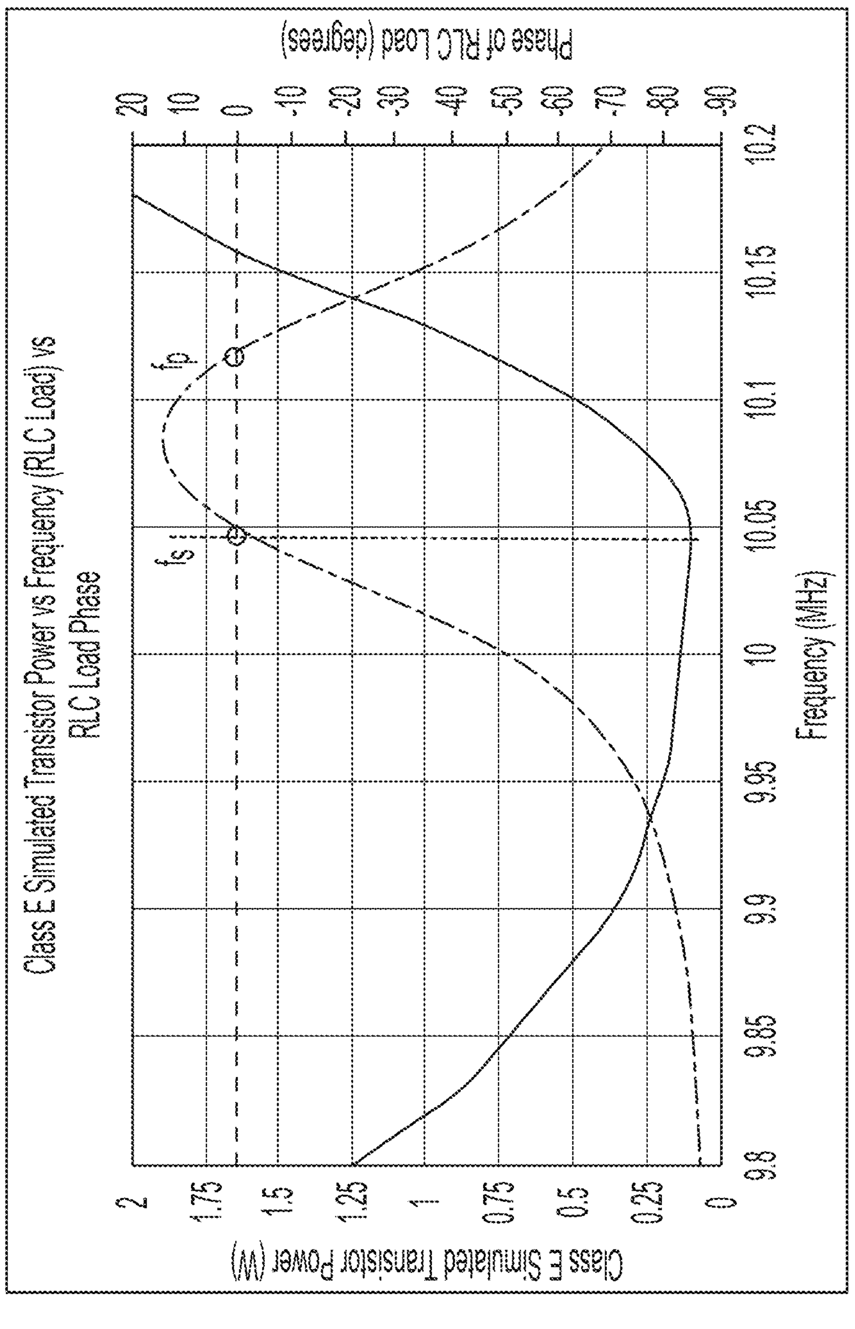
FIG. 5B is a comparison chart of simulated transistor power versus frequency of a modelled RA-MEMS SAW device.

For high Q-factor loads it is important to use the correct signal frequency to avoid poor system efficiencies. The correct frequency of operation is the resonance frequency of the load $f_{res}=f_s$. The figures below show the simulated efficiency of a Class E power amplifier (FIG. 5A—curve 502) and Phase of the load (FIG. 5A—curve 504). As can be seen in the figure the optimal system efficiency frequency corresponds well to the resonance frequency $f_s$. FIG. 5B shows the power burned in the transistor, which corresponds to the temperature of the transistor as a comparison to the phase of load. As can be seen, the transistor temperature is minimized at the resonance frequency.

Figure 6:
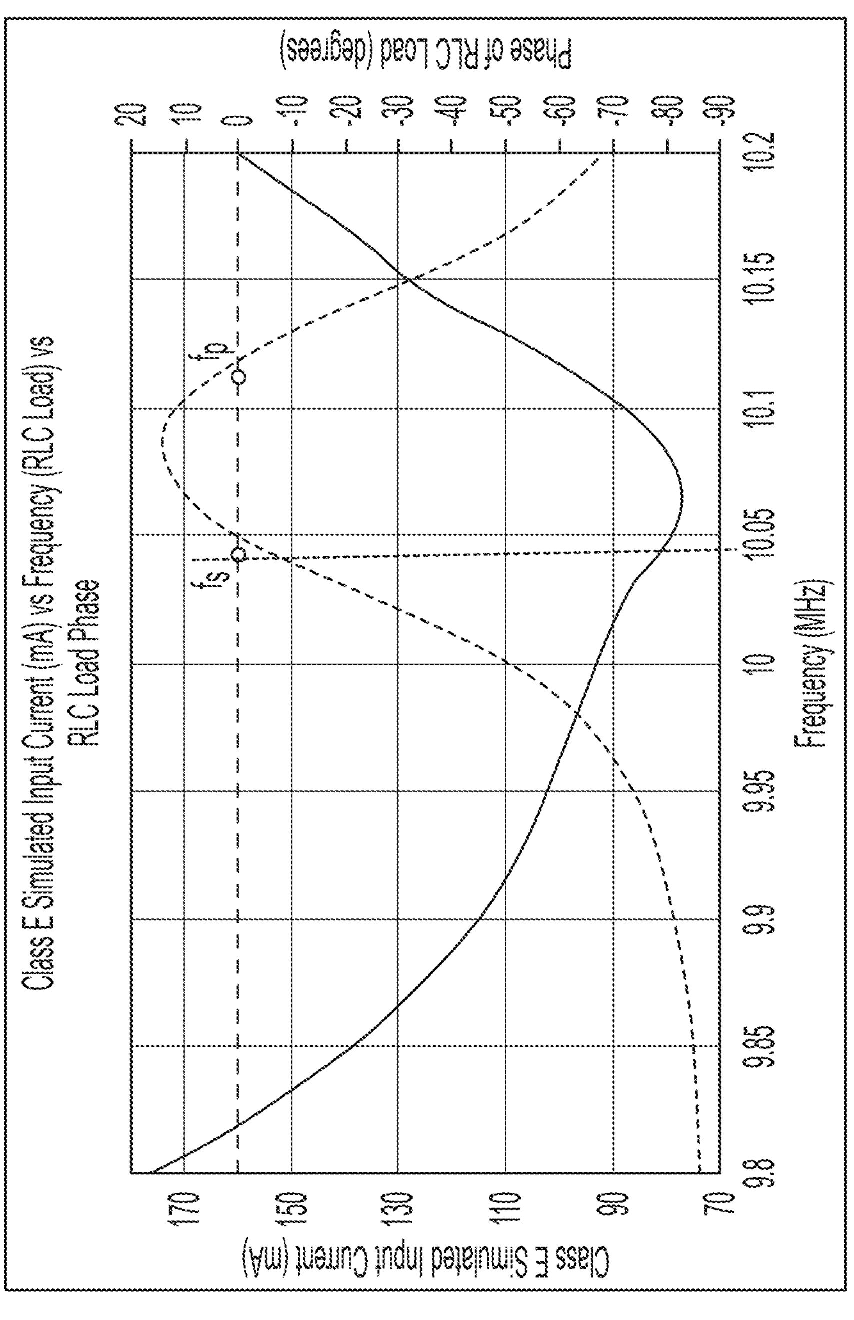
FIG. 6 is an example of a simulated Class E Input Current and Series Resonance.

Referring to FIG. 6, either efficiency (maximum) or transistor temperature (minimum) may used to locate the series resonance, however two alternate methods may also be implemented in embodiments of the system: Minimum Input current/power, as shown in FIG. 6, and/or Minimum Output amplitude, or Peak-to-peak voltage (Vpp), as shown in FIG. 7.

Figure 7:
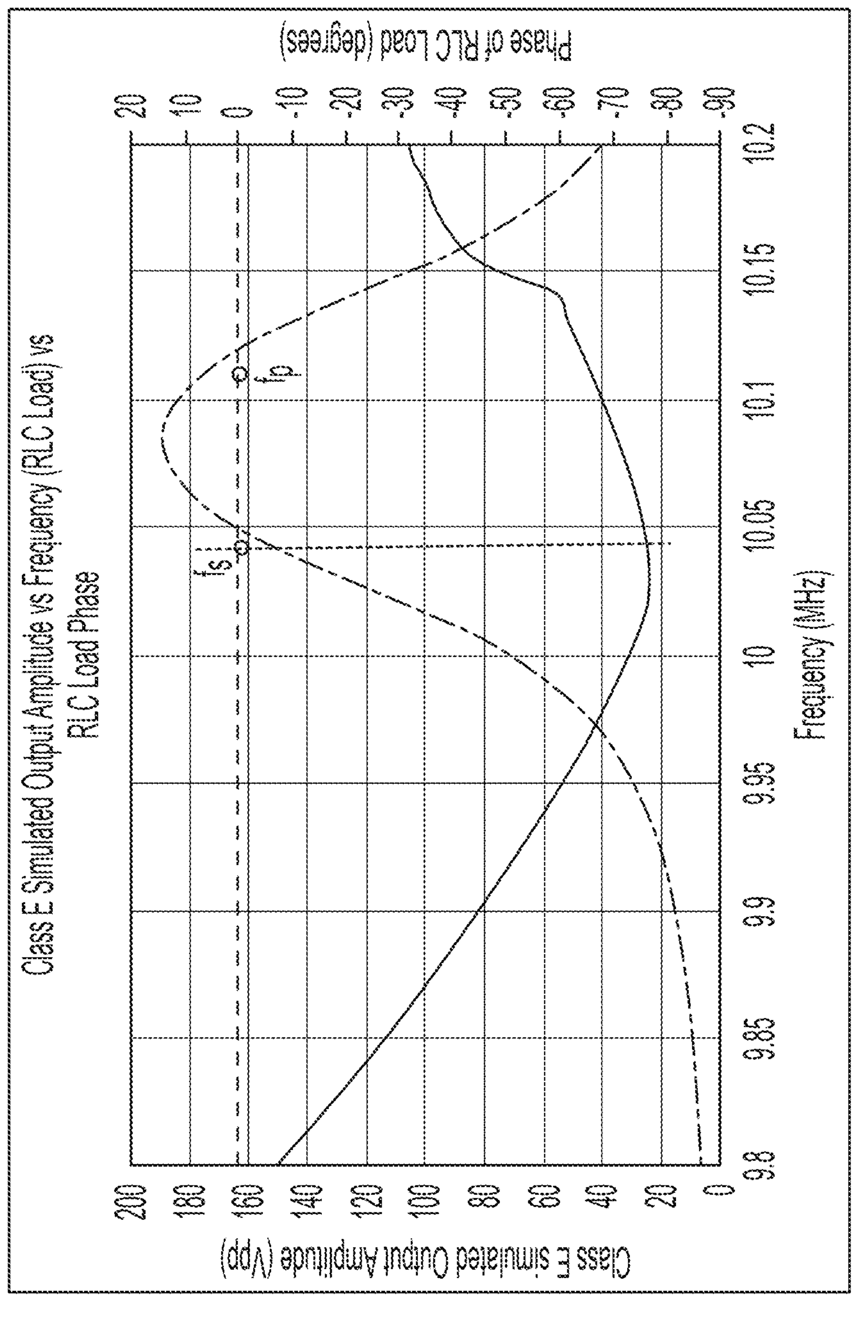
FIG. 7 is an example of a simulated Class E Output Amplitude and Series Resonance.

Both the FIGS. 6-7 show good agreement with the series resonance and provide a basis for the use of affordable and widely available sensors for locating resonance with this system. For this type of amplifier (Class E) therefore, actively finding, and exciting at or near the minimum current, output amplitude, or transistor temperature may ensure excitement of the load's series resonance, and in the case of RA-MEMS the mechanical resonance too.

Figure 8:
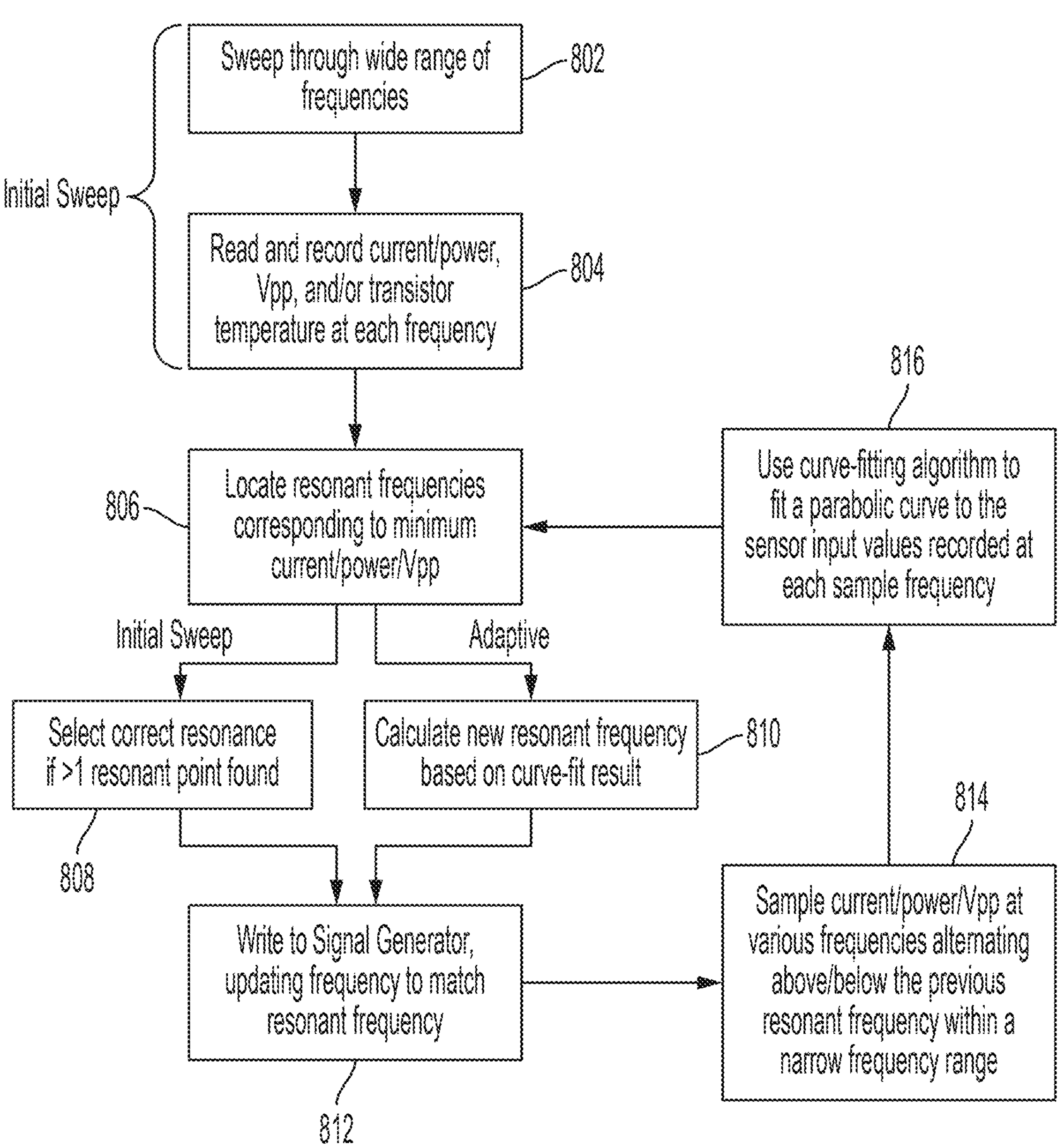
FIG. 8 is a flow diagram of initial sweep and adaptive algorithms for use in the system of FIG. 3.

Automating this process can be done with a programmed microcontroller. The process of finding the resonant frequency and maintaining operation at this frequency with a system such as illustrated in FIG. 3 is governed by the two algorithms outlined in FIG. 8, which can be classified as the controller's 'initial sweep' algorithm and its 'adaptive curve-fitting' algorithm. Referring to FIG. 8, when the device is first connected a wide frequency range (range defined by expected variability of load resonance) is swept (at 802) across the device's entire operating frequency range, while electrical characteristics are measured (at 804), and the resonant frequencies are directly identified (at 806), corresponding to whether the current, power, or Vpp are being used as the defining variable.

In the case where multiple resonances are found the preferred is selected (at 808), either manually or autonomously (for example it makes frequency decisions based on minimum values of current, Vpp or temp), and written to the signal generator (at 812). For static systems this would be sufficient, and device would continue operation at that frequency. In one embodiment, it is contemplated that the device has a single resonance peak. If there are two, the resonant peak closer to where it is expected to be found at the moment is selected (e.g., the resonance that is the best near the expected range). There are instances where two might be employed, for example i) second resonance peak is used as a unique identifier, or ii) for jumping between peaks.

To track the resonance of a dynamic load, however, the microcontroller must continuously re-locate the moving resonant frequency and update the signal generator autonomously. This may be achieved by repeatedly sampling frequencies near the stored resonance value (at 814). To reduce time spent sampling, a few samples are taken and a curve-fitting algorithm is used locate the new resonant frequency (at 816).

Figure 9:
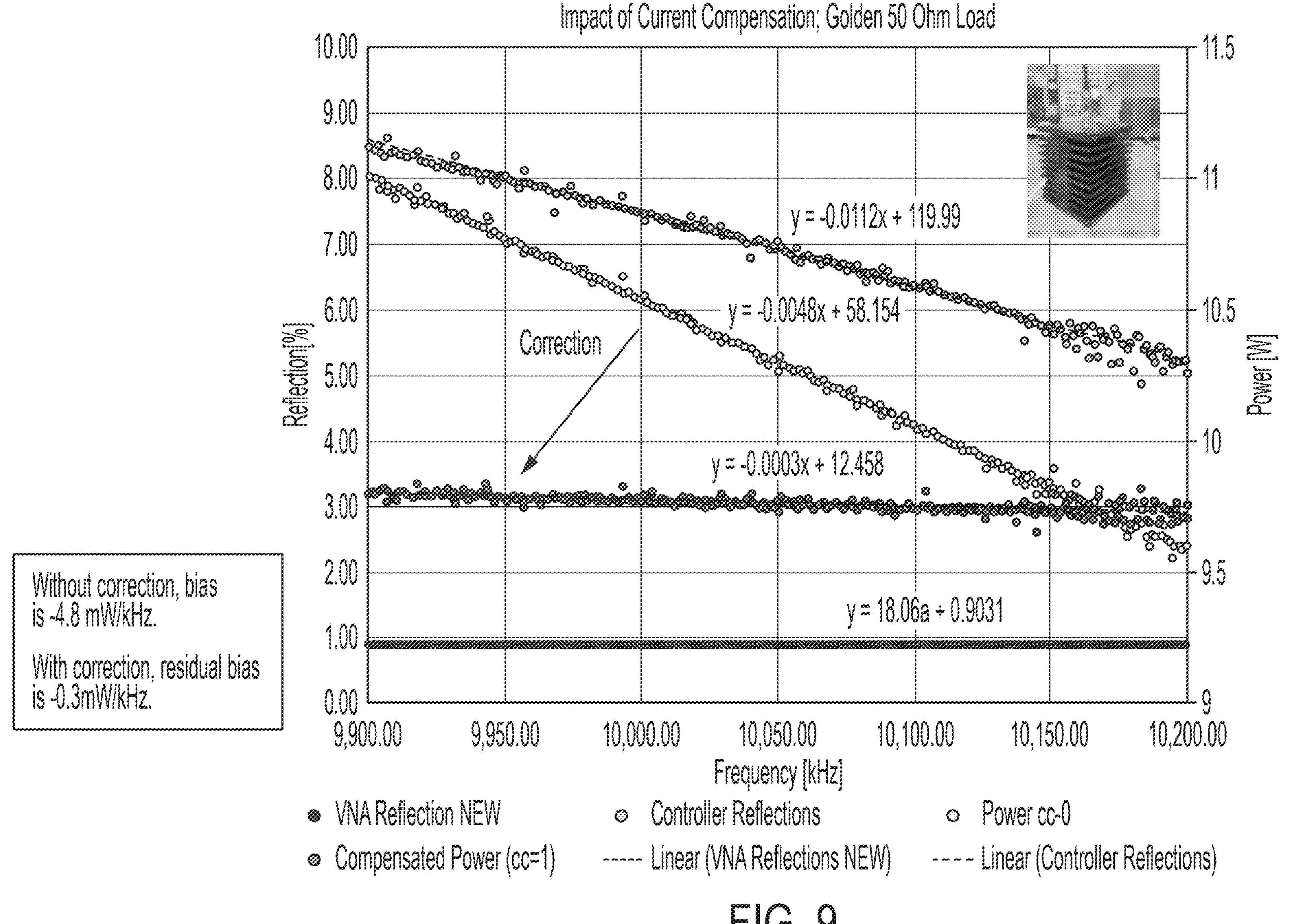
FIG. 9 is a graph of hypothetical effects of compensation/calibration demonstrated with a static 50 ohm reference load.

It is anticipated that the system presented herein may produce excellent results by enabling a very efficient RA-MEMS driving system. However, further optimization methods are contemplated that may increase the efficiency and mechanical driving force of the Class E power amplifiers. For example, there may be a frequency bias and corresponding uncertainty due to variance in components of the Class E amplifier. This may be addressed by applying a calibration procedure: Presenting a known load and measuring the system response across the operating frequency range, and mathematically obtaining a correction factor. This factor can then be used to update algorithm parameters which may be used for improved resonance tracking. Statistical methods can also be used to address component variance to keep system LC network within tolerance (i.e., use combinations of components to achieve LC network goals instead of individual components). As shown in FIG. 9, expected results for optimizing resonance tracking can help to reduce reflections and power usage.

For dynamic loads (where resonant frequency is changing quickly), if the sampling rate is slow the data can become stretched/dilated or compressed depending on whether the resonance is moving towards or away from it, presenting a transient error. One way to mitigate this is to avoid sampling frequencies sequentially, but rather move above and below the resonant frequency in an alternating fashion. This also prevents extended periods away from resonance if resonance is moving away from where the sequence started. For less dynamic loads, such as those loads that change less with time, the signal generator may return to the previous resonance for a time between sampling of frequencies to reduce time spent off resonance.

Among other techniques, noise in the data can be managed by controlling the range of the sweep (See FIG. 8 at 802), for example by making noise less of a factor through increasing the signal strength by taking a wider sweep and thus achieving a higher signal-to-noise ratio (SNR). Yet other techniques for managing noise in the data, that may be used together with or separately from controlling sweep range, include changing number of samples by adjusting frequency step size, and by using a robust curve fitting method (See FIG. 8 at 816). Noise can be become significant in fluidic applications (e.g., atomization).

Signal amplitude modulation can be used for further improved efficiencies. This may be applied to the system described but must not disrupt the adaptive process. We have found success by modulating between frequency sampling cycles.

Further efficiencies can be gained by using algorithms to prioritize and weigh accuracy against speed of matching/adapting the output frequency to resonant frequency of the load. For example, the rate at which the adaptive algorithm tracks resonant frequency is important when a load is first connected, and the search domain is large. The rate may depend on, or be adjusted in light of, how frequently the algorithm is implemented, how large the frequency steps are in a sweep, how long the circuitry of the system needs to process each step, and how accurate the algorithm is. Other circumstances include external factors during operation that make the load highly dynamic such as rapid heat (power change) or sudden mass/fluid loading. For dynamic systems with a less rapidly changing resonance (near steady state) prioritizing accuracy may become more beneficial to efficiency goals. Fewer and larger steps will improve speed, and frequent and small steps will improve accuracy. Minimizing time and frequency delta away from resonance will overall improve efficiency. A suitable algorithm, such as described in in FIG. 8, may also employ an adjustable step size technique to achieve this effect. As noted above, the version of tracking resonance set forth in FIG. 8 is in the form of a "hill climbing" type of algorithm. Other algorithms for tracking the inputs/outputs to microcontroller have also been contemplated.

Figure 11A:
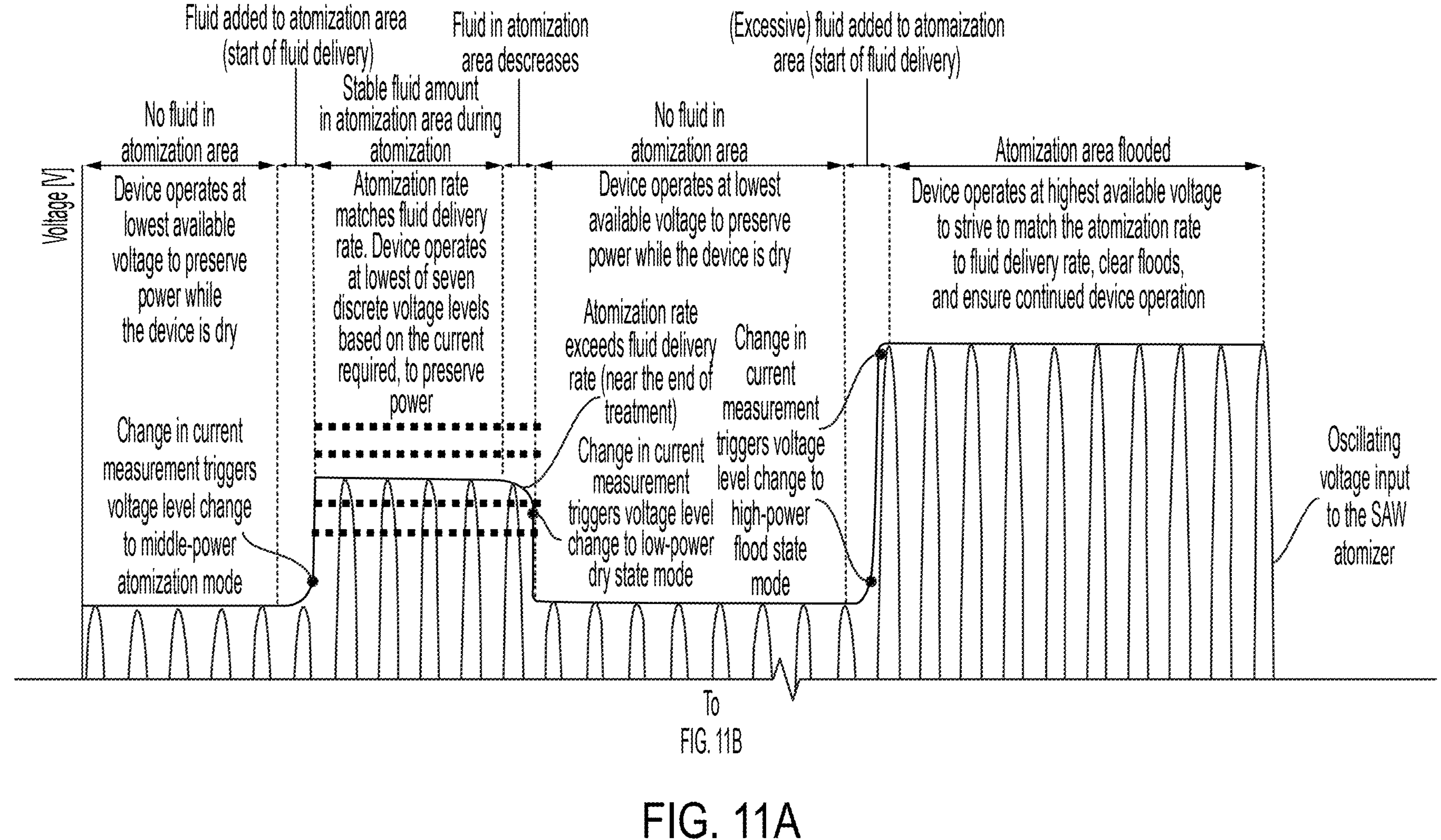
Figure 11B:
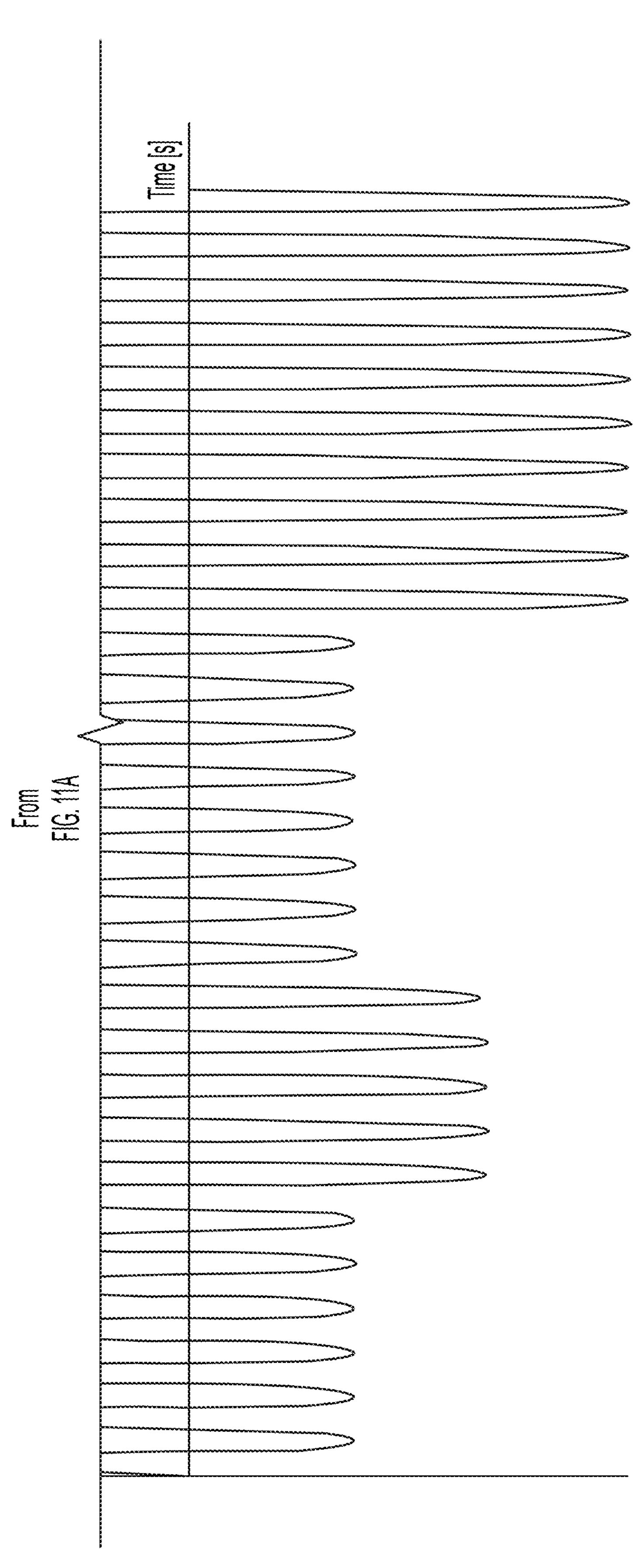

Fluid Sensing:

FIGS. 11A-B are an example of a generator frequency versus time plot using the system of FIG. 3 demonstrating how an embodiment of a fluid detection algorithm uses the microcontroller to change input voltage, and therefore input power, during atomization, based on the amount of fluid applied to the device.

As used herein, acoustofluidics refers to the manipulation of small fluid systems using ultrasound. Types of manipulations include acoustic streaming, heat transfer, bubbles/cavities, particle manipulation/separation, tweezering and atomization. Common methods of generating sound waves include Surface Acoustic Wave (SAW), Lamb wave, Bulk Acoustic Wave (BAW), Pseudo-SAW and hybrid wave and can be standing or travelling.

With fluid sensing capability and providing that input via an algorithm to the microcontroller several opportunities become available:

Standby Mode: where the device waits in low power state until fluid is added. This is beneficial for use with a fluid supply that is not controlled by the microcontroller and helps the system to conserve energy and minimizing unnecessary heating of the device.

User Feedback: If the fluid supply fails, a feedback system can be used to indicate that fluid is not detected this is useful for error alerts, end of treatment alerts, and can be used to track how long and at what rate the device was active for, for therapeutic applications this can be used as a dose tracking tool. Because flood is also detected, an alert can tell the user that the flow rate has exceeded the device's safe operating range Power throttling: With flood sensing capability (atomization application), the detection of fluid/flood can be used to throttle the power. Power can be reduced until flood is detected then increased to recover from flood systematically until a minimum power level is found for the given fluid load.

Pump Control and Feedback Loop

Fluid heating: by providing excess power to be delivered into the fluid.

Detecting different fluids: fluid characteristics such as viscosity and surface tension properties can be detected.

Figure 10A:
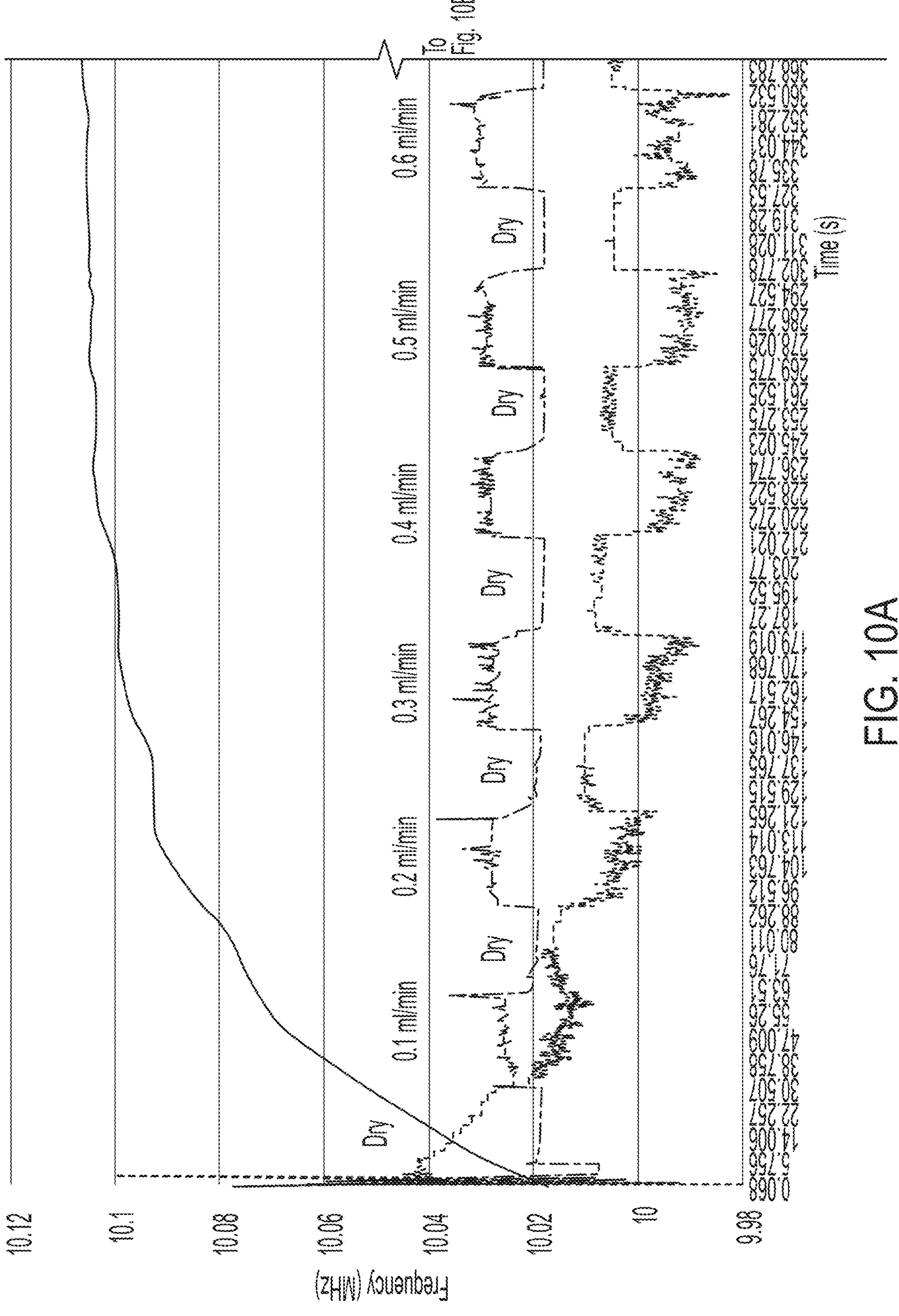
FIGS. 10A-B are a chart of simulated input current and frequency response using the system of FIG. 3 and the method of FIG. 8 rather than a static frequency generator.
Figure 10B:
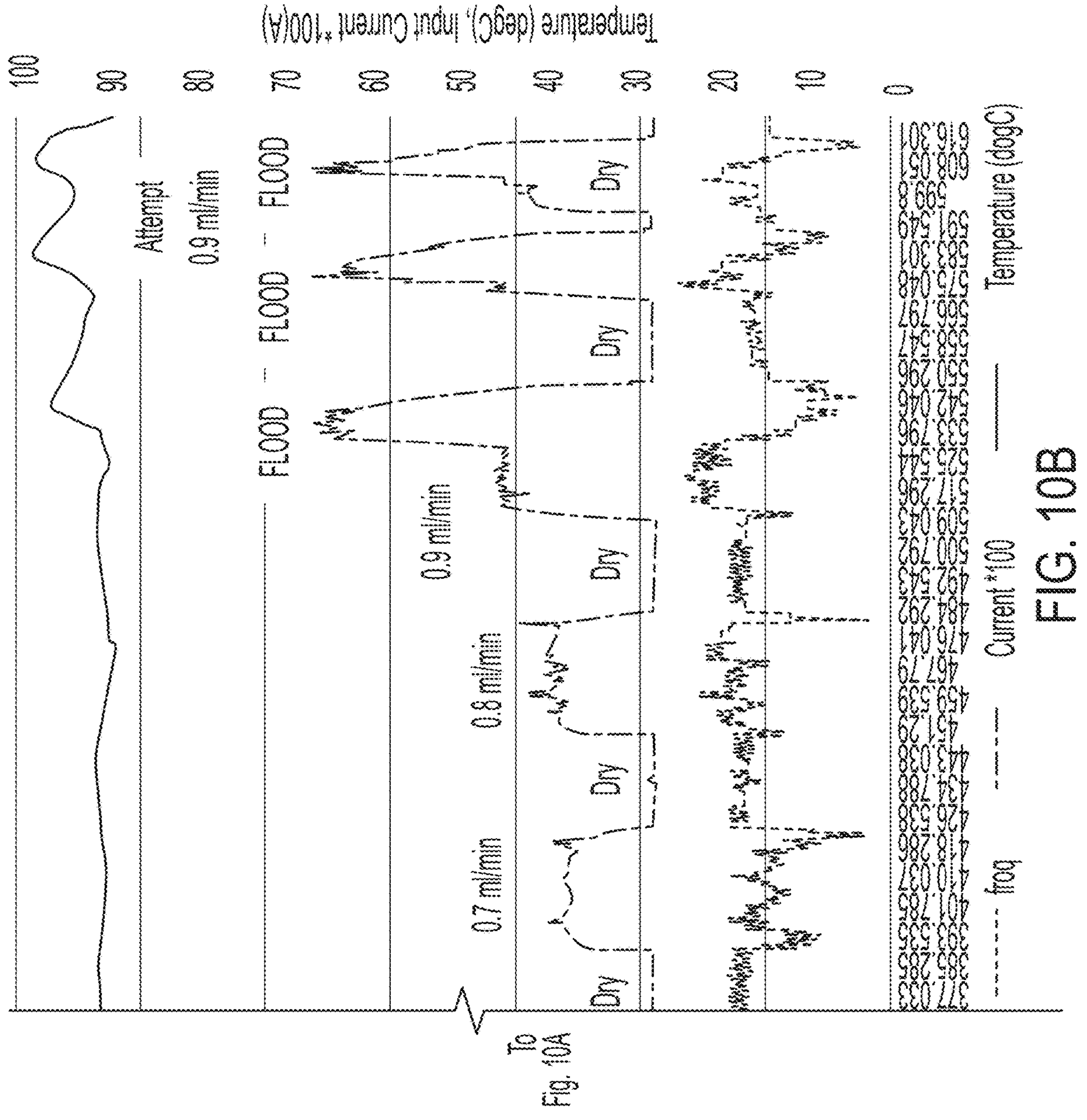

When the load impedance abruptly changes for the adaptive system described it manifests as an abrupt change in input current/power, output amplitude (Vpp) and change in resonant frequency (see FIGS. 10A-B). For acoustofluidics, this means it can detect the addition of fluid, and the amount of fluid on the device. FIGS. 10A-B are a graphed data set from an adaptive controller's log file where the load was an RA-MEMS SAW atomizer with an initial resonant frequency of ~10 [MHz]. During the test run represent by FIGS. 10A-B, fluid was added periodically to the surface of the atomizer at different flow rates. The input current and frequency response can be seen in the yellow and orange graphs respectively. The initial drop in frequency is due to the heating of the atomizer (seen by blue graph). The three peaks on the right represent when the device is overwhelmed with fluid ("flooded').

FIGS. 11A-B demonstrate how the fluid detection algorithm uses the microcontroller to change input voltage, and therefore input power, during atomization, based on the amount of fluid applied to the device. When the device is dry (sensed by a low current draw indicating that fluid levels are below a threshold that indicates a dry chip) the device operates at a low voltage, because higher power is not necessary and is wasteful. An abrupt change in current measurement tells the microcontroller that fluid has been added to the chip. The measurement is compared against a set of calibrated threshold values and the system sets the input voltage to one of seven 'wet' or atomizing states (only five states pictured in FIGS. 11A-B for clarity). During this wet state, the device can finely tune where the voltage level will be set and will always reside in the lowest-possible power state, whilst still maintaining consistent and safe atomization.

The right-hand side of FIGS. 11A-B illustrates what occurs when the chip becomes overwhelmed with fluid, causing a flood. The spike in current measurement is what triggers the resulting spike in voltage. This higher-power state aims to clear the flood and continue normal atomization of the device for as long as possible, even in the fluid-overwhelmed state. The device is designed carefully that the so called 'flood state' or voltage at flood state, provides ample power to clear fluid rates in high excess of normal recommended atomization rates. This, among other safety features, allows the user tremendous flexibility in their treatment times. A higher manually set flow rate will result in a higher power and faster medicinal delivery. Conversely, a lower flow rate will increase the treatment time but greatly reduce the input power consumed.

In normal operation, the device's pump will respond to the recorded changes in current and the corresponding fluid state. In wet states, the pump will remain relatively constant, with some deviations to its duty cycle based on which wet state the system resides in. In the dry state, the pump will increase duty cycle. This is very helpful as it will keep the device atomizing for the entire duration of the treatment unless otherwise specified. In the flood state, the pump drastically reduces its duty cycle, or even shuts off completely, until the measurements recorded by the microcontroller indicate it is safe to begin atomization again.

Further discussion and other embodiments of optimizing performance of a SAW atomizer, including embodiments that may be used in combination with, or independently from, the embodiments disclosed above include:

Load Sensing and circuit protection—High mismatch conditions are easily detected with the system described. Open and short circuits can be detected with Vpp, input current, and transistor temperature data. Thresholds can be used to protect circuit and cut or throttle power to the amplifier to protect the transistor. This capability can also be used to help with troubleshooting and alerting users of a problem when load is not in expected range.

Temperature Sensing—If temperature coefficient of frequency for load is known, this tracking system will know the chip temperature. This information can be used to throttle power (if load temperature must be controlled) or increase modulation if desired.

Heat transfer/Self Disinfection—Without resonance tracking system signal power delivered to an RA-MEMS may be limited because of de-tuning from TCF characteristic of these devices. The device will start to reflect power as it detunes. Limited power admitted to the device means limited temperatures a device can reach for a given supply. With an adaptive solution the limit is much higher for as relatively more power is admitted to the load. This combined with temperature sensing capability would allow higher and specific temperatures to be achieved, for applications that require significant controlled heating (such as self-disinfection).

Memory/Intelligence—Multiple resonance peaks may be used to indicate a specific device, like a signature, fingerprint, or UDI. This has many potential uses including use tracking, (medications/dosing).

Add on Features (Lab Applications)—For lab applications additional tools for off frequency experimenting can be added such as a toggle and dial tool for manually deviating from autonomously found resonance. Autonomous offsets can also be used to excite a controlled distance from resonance.

The invention claimed is:

1. A system comprising:

a zero voltage switching amplifier;

a variable signal generator in communication with the zero voltage switching amplifier;

a resonant load in communication with the zero voltage switching amplifier;

a sensor associated with the zero voltage switching amplifier and configured to measure an operational parameter of the zero voltage switching amplifier;

a microcontroller in communication with a memory, wherein the memory comprises instructions for causing the microcontroller to execute:

a hill-climbing algorithm, wherein the hill-climbing algorithm causes the microcontroller to locate a resonant frequency of the resonant load by sampling frequencies by changing a frequency of the variable signal generator and recording sensor data, then correlating the collected sensor data (minima) to the resonance.

2. The system of claim 1, wherein the sensor comprises an input current sensor and an input power sensor for the zero voltage switching amplifier.

3. The system of claim 1, wherein the sensor comprises a temperature sensor for measuring a temperature of the zero voltage switching amplifier.

4. The system of claim 2, wherein:

the resonant load comprises a dynamic load; and the microprocessor is configured to execute an autonomous and recurring version of the hill-climbing algorithm.

5. The system of claim 1, wherein where the algorithm is configured to identify sensor value changes that are unrelated to frequency sampling, indicating a change in the load.

6. The system of claim 5, wherein where the algorithm is configured to increase or decrease an input voltage to the zero voltage switching amplifier in response to a change in the load.

7. The system of claim 5, wherein:

sensor information regarding load change is indicative of the absence, presence or overabundance of fluid for an RA-MEMS acoustofluidics atomizer; and the microcontroller is configured to optimize the input voltage to satisfy a fluid rate without allowing the fluid rate to flood the RA-MEMS acoustofluidics atomizer.

8. A method comprising:

measuring, with a sensor associated width a zero voltage switching amplifier, an operational parameter of the zero voltage switching amplifier; and executing, with a microcontroller, a hill-climbing algorithm that causes the microcontroller to locate a resonant frequency of a resonant load in communication with the zero voltage switching amplifier by sampling frequencies by changing a frequency of a variable signal generator in communication with the zero voltage switching amplifier, recording sensor data, and then correlating the collected sensor data (minima) to the resonance.

9. The method of claim 8, wherein the sensor comprises an input current sensor and an input power sensor for the zero voltage switching amplifier.

10. The method of claim 8, wherein the sensor comprises a temperature sensor for measuring a temperature of the zero voltage switching amplifier.

11. The method of claim 9, wherein:

the resonant load comprises a dynamic load; and the microprocessor is configured to execute an autonomous and recurring version of the hill-climbing algorithm.

12. The method of claim 8, wherein the algorithm is configured to identify sensor value changes that are unrelated to frequency sampling, indicating a change in the load.

13. The method of claim 12, wherein the algorithm is configured to increase or decrease an input voltage to the zero voltage switching amplifier in response to a change in the load.

14. The method of claim 12, wherein:

sensor information regarding load change is indicative of the absence, presence or overabundance of fluid for an RA-MEMS acoustofluidics atomizer; and the microcontroller is configured to optimize the input voltage to satisfy a fluid rate without allowing the fluid rate to flood the RA-MEMS acoustofluidics atomizer.

* * * * *